(12) United States Patent
Ikeuchi et al.

(10) Patent No.: US 6,191,654 B1
(45) Date of Patent: Feb. 20, 2001

(54) DIFFERENTIAL AMPLIFIER CIRCUIT

(75) Inventors: Akira Ikeuchi, Atsugi; Kyozo Makime, Isehara, both of (JP)

(73) Assignee: Mitsumi Electric Co., Ltd., Tokyo (JP)

( * ) Notice: Under 35 U.S.C. 154(b), the term of this patent shall be extended for 0 days.

(21) Appl. No.: 09/328,013

(22) Filed: Jun. 8, 1999

(30) Foreign Application Priority Data

Jun. 11, 1998 (JP) .................................................. 10-163895

(51) Int. Cl.[7] ...................................................... H03F 3/45
(52) U.S. Cl. ........................ 330/252; 330/310; 330/261; 330/259; 330/257
(58) Field of Search .................................. 330/252, 257, 330/259, 260, 261, 310

(56) References Cited

U.S. PATENT DOCUMENTS 5,966,046 * 10/1999 Bezzam et al. ...................... 330/252
6,023,196 * 2/2000 Ashby et al. ........................ 330/259

* cited by examiner

Primary Examiner—Michael B Shingleton
(74) Attorney, Agent, or Firm—Andrus, Sceales, Starke & Sawall, LLP

(57) ABSTRACT

A differential amplifier circuit for amplifying and outputting a differential voltage between a pair of input terminals includes a voltage-to-current converting circuit, a current amplifying circuit, and a current-to-voltage converting circuit. In the voltage-to-current converting circuit, each of the input terminals is connected with one end of each of resistances, a potential on the other end of each of the resistances is kept constant by a feedback circuit, and an electric current corresponding to the differential voltage flows into a first differential circuit. In the current amplifying circuit, the electric current corresponding to the differential voltage and flowing into the first differential circuit is amplified and then flows into a second differential circuit. In the current-to-voltage converting circuit, an electric current outputted from the current amplifying circuit is converted to a voltage to be outputted.

4 Claims, 3 Drawing Sheets

DIFFERENTIAL AMPLIFIER CIRCUIT

BACKGROUND OF THE INVENTION

1. Field of the Invention

The present invention relates to a differential amplifier circuit and more particularly to a differential amplifier circuit which is able to amplify and output a difference voltage between a pair of input voltages.

2. Description of the Related Art

FIG. 4 shows a well-known conventional differential amplifier circuit. In this circuit, a pair of input terminals IN– and IN+ are connected with two ends of a signal source 10. An output voltage Vin of the signal source 10 is superimposed on an output voltage V1 of a DC voltage power supply 11 which is connected with the input terminal IN+, and is applied across the input terminals IN– and IN+.

The input terminals IN– and IN+, via respective resistances R1, are connected with inverting and non-inverting input terminals of an operational amplifier 12. The inverting input terminal of the operational amplifier 12, via a resistance R2, is connected with an output terminal of the operational amplifier 12 and an output terminal 14. The non-inverting input terminal of the operational amplifier 12 is connected with a DC voltage power supply 13 of a voltage V2 via a resistance R3. In addition, the operational amplifier 12 is supplied with a power source and a ground.

The differential amplifier circuit amplifies R2/R1 times the signal voltage Vin which is superimposed on the DC voltage V1, and thereafter superimposes the amplified voltage on the DC voltage V2 so as to output an amplified-and-superimposed voltage Vout.

In the conventional circuit shown in FIG. 4, the DC voltage V1, being superimposed with the signal voltage Vin, must be small enough to meet a condition "0<VA<Vcc" with respect to the power supply Vcc and ground (0V) of the operational amplifier 12. In the above, "VA" denotes a voltage of the non-inverting input terminal of the operational amplifier 12.

For example, in a case of using the above-mentioned differential amplifier circuit as a current sense amplifier circuit for detecting a current charging or discharging a secondary accumulator, since the secondary accumulator outputs a voltage having a large voltage variation, the power supply Vcc of the differential amplifier circuit supplies a stable voltage by using a regulator to stabilize the output voltage of the secondary accumulator. In general, an output voltage of the regulator is lower than that of the secondary accumulator because of a relationship "VA=R2(V1−V2)/(R1+R2)".

However, in a current sense amplifier in which a differential voltage between two ends of a small resistance inserted between a secondary accumulator and a load is amplified by a differential amplifier circuit, respective voltages applied to the two ends of the small resistance are about as high as an output voltage of the secondary accumulator and higher than an output voltage of the regulator. For this reason, the current sense amplifier does not meet the condition "0<VA<Vcc" of the differential amplifier circuit in FIG. 4 and therefore cannot be applied in the above-mentioned current sense amplifier.

Furthermore, in the circuit of FIG. 4, if V1 is not equal to V2, an electric current I (I=(V1−V2)/(R1+R2)) always flows through the respective resistances R1 of the input terminals IN– and IN+, and, as a result, consumed power will be increased.

SUMMARY OF THE INVENTION

It is a general object of the present invention to provide a differential amplifier circuit in which the above disadvantages are eliminated.

A more specific object of the present invention is to provide a differential amplifier circuit capable of amplifying a differential voltage between a pair of input terminals even if respective voltages of the input terminals are higher than a source voltage.

According to one aspect of the present invention, there is provided a differential amplifier circuit for amplifying and outputting a differential voltage between a pair of input terminals, which differential amplifier circuit comprises a voltage-to-current converting circuit in which each of the input terminals is connected with one end of each of resistances, a potential on the other end of each of the resistances is kept constant by a feedback circuit, and an electric current corresponding to the differential voltage flows into a first differential circuit; a current amplifying circuit in which the electric current corresponding to the differential voltage and flowing into the first differential circuit is amplified and then flows into a second differential circuit; and a current-to-voltage converting circuit in which an electric current outputted from the current amplifying circuit is converted to a voltage and the voltage is outputted. The input terminals supply power to the voltage-to-current converting circuit consisting of transistors.

Thus, even though input voltages of the input terminals are higher than the source voltage, a differential voltage between the input terminals can be converted to an electric current so that the differential voltage can be amplified and outputted.

BRIEF DESCRIPTION OF THE DRAWINGS

Further objects and advantages of the present invention can be more fully understood from the following detailed description, in conjunction with the accompanying drawings, in which.

DETAILED DESCRIPTION OF THE PREFERRED EMBODIMENT

Figure 1:
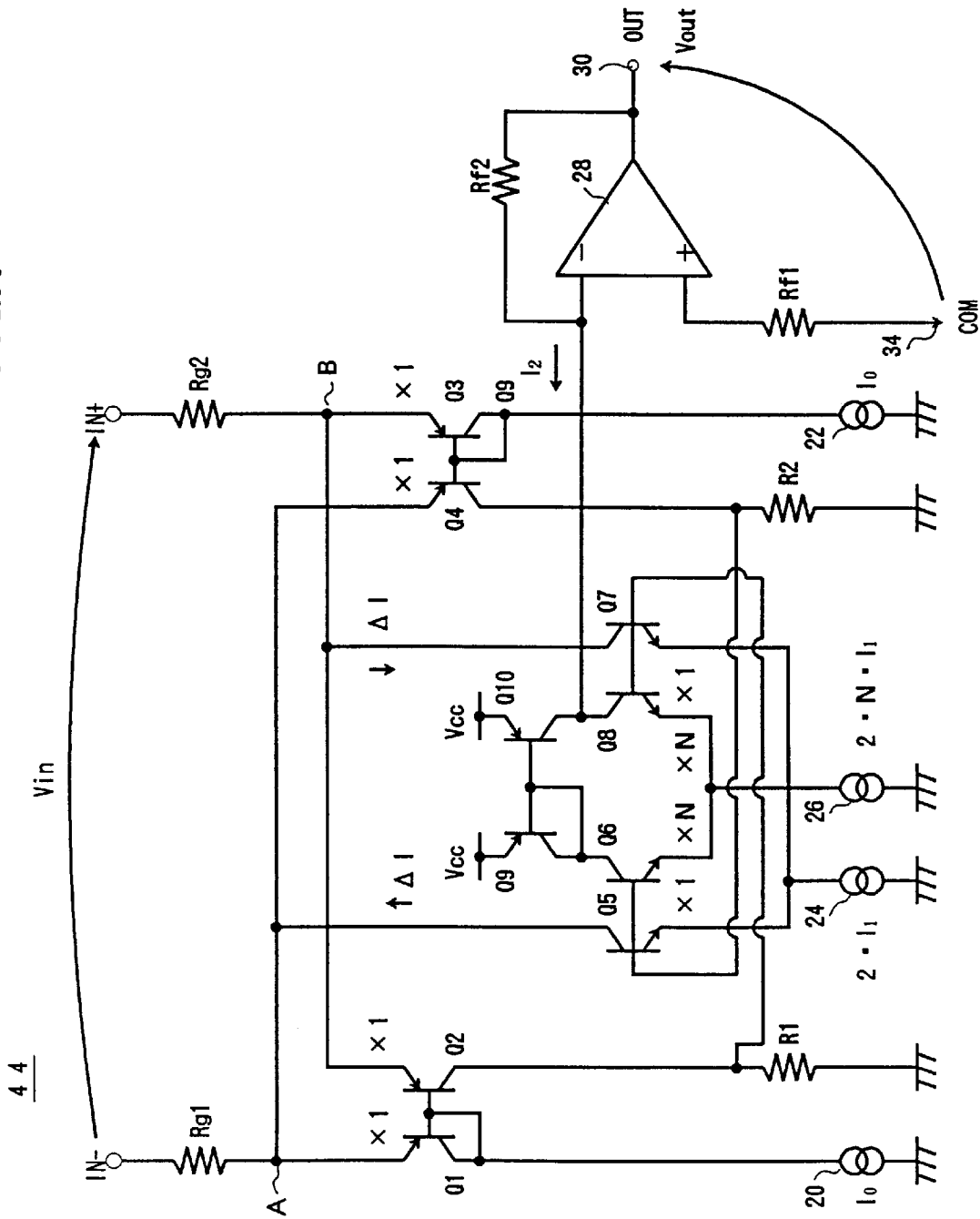
FIG. 1 is a view of a differential amplifier circuit according to an embodiment of the present invention.

FIG. 1 is a view of a differential amplifier circuit according to an embodiment of the present invention.

In this diagram, Q1, Q2, Q3 and Q4 denote pnp transistors, Q5, Q6, Q7 and Q8 denote npn transistors, and Q9 and Q10 denote pnp transistors.

An input terminal IN– is connected with one end of a resistance Rg1, and emitters of the transistors Q1 and Q4 are connected with the other end of the resistance Rg1. A base and collector of the transistor Q1 and a base of the transistor Q2 are commonly connected with an end of a constant current power supply 20 which supplies electric current $I_0$. The other end of the constant current power supply 20 is grounded. A surface ratio of bases of the transistors Q1 and Q2 is designed to be 1:1. The transistors Q1 and Q2 form a current mirror circuit.

An input terminal IN+ is connected with an end of a resistance Rg2 (Rg2=Rg1=Rg), and emitters of the transistors Q2 and Q3 are connected with the other end of the resistance Rg2. A collector of the transistor Q2 is grounded through a resistance R1. A base and collector of the transistor Q3 and a base of the transistor Q4 are commonly connected with an end of a constant current power supply 22 which supplies the electric current $I_0$. The other end of the constant current power supply 22 is grounded. With regard to the transistor Q4, the emitter is connected with the other end of the resistance Rg1 and a collector is grounded through a resistance R2 (R2=R1). A surface ratio of bases of the transistors Q3 and Q4 is designed to be 1:1. The transistors Q3 and Q4 form a current mirror circuit.

The collector of the transistor Q4 and the resistance R2 have a connection point, and respective bases of the transistors Q5 and Q6 are commonly connected with the connection point. A surface ratio of the bases of the transistors Q5 and Q6 is designed to be 1:N. A collector of the transistor Q5 is connected with a point A which is a point connecting the emitter of the transistor Q1 and the resistance Rg1. Emitters of the transistor Q5 and the transistor Q7 are commonly connected with an end of a constant current power supply 24 which supplies an electric current $2 \cdot I_1$. The other end of the constant current power supply 24 is grounded. The transistors Q5 and Q7 form a first differential amplifier circuit.

The collector of the transistor Q2 and the resistance R1 have a connection point, and respective bases of the transistors Q7 and Q8 are commonly connected with the connection point. A surface ratio of the bases of the transistors Q7 and Q8 is designed to be 1:N. A collector of the transistor Q7 is connected with a point B which is a point connecting the emitter of the transistor Q3 and the resistance Rg2. Emitters of the transistors Q6 and Q8 are commonly connected with an end of a constant current power supply 26 which supplies an electric current $2 \cdot N \cdot I_1$. The other end of the constant current power supply 26 is grounded. The transistors Q6 and Q8 form a second differential amplifier circuit.

A collector of the transistor Q6 is connected with a collector of the transistor Q9. Similarly, a collector of the transistor Q8 is connected with a collector of the transistor Q10. The transistors Q9 and Q10 form a current mirror circuit such that emitters thereof are respectively connected with power supplies Vcc, and bases thereof are commonly connected with the collector of the transistor Q9.

The collector of the transistor Q8 is connected with an inverting input terminal of an operational amplifier 28, and a non-inverting input terminal of the operational amplifier 28 is supplies with a common potential COM through a resistance Rf2 from a terminal 34. The inverting input terminal of the operational amplifier 28 is connected with an output terminal of the operational amplifier 28 and an output terminal 30 via a resistance Rf2 (Rf2=Rf1=Rf). In addition, the operational amplifier 28 is supplied with a power supply Vcc and a ground, and an output voltage Vout with respect to the common potential COM is outputted from the output terminal 30.

Herein, a signal voltage (differential voltage) Vin is applied between the input terminals IN+ and IN−. A voltage of the connection point A, regardless of the voltage of the input terminal IN−, is adjusted to be equal to that of the connection point B by a feedback of the transistors Q4 and Q5. The voltage of the connection point B, regardless of the voltage of the input terminal IN+, is adjusted to be equal to that of the connection point A by a feedback of the transistors Q2 and Q7.

For example, in a case in which a voltage of the input terminal IN+ is raised against that of the input terminal IN−, as a potential of the connection point B is raised, a collector current and a collector potential of the transistor Q2 are increased, thereby a base potential of the transistor Q7 is raised and a collector current of the transistor Q7 is increased by $\Delta I$, and thus the potential of the connection point B is dropped. Furthermore, since the collector current $I_0$ of the transistor Q3 is constant, the potential of the connection point B is kept constant.

At this time, as a potential of the connection point A is dropped, a collector current and a collector potential of the transistor Q4 are decreased, thereby a base potential of the transistor Q5 is dropped and a collector current of the transistor Q5 is decreased by $\Delta I$, and thus the potential of the connection point A is raised. Furthermore, since the collector current $I_0$ of the transistor Q1 is constant, the potential of the connection point A is kept constant.

In the above-mentioned state, electric currents Irg1 and Irg2 respectively flowing through the resistances Rg1 and Rg2 may be expressed by the following formulas:

$$IRg1 = 2 \cdot I_0 + I_1 - \Delta I$$

$$IRg2 = 2 \cdot I_0 + I_1 + \Delta I$$

A voltage-to-current converting circuit consists of the transistors Q1 to Q5 and Q7, the resistances Rg1 and Rg2, and the constant current power supplies 20, 22 and 24, in which circuit the signal voltage between the input terminals IN+ and IN− is converted to an electric current $\Delta I$ flowing through the transistors Q5 and Q7.

Further, since the transistors Q5 and Q6 have the bases thereof communicated together as do the transistors Q7 and Q8, collector currents $I_{CQ5}$ to $I_{CQ10}$ of the transistors Q5 to Q10 can be calculated according to the following formulas:

$$I_{CQ6} = N \cdot I_{CQ5} = N \cdot I_1 - N \cdot \Delta I$$

$$I_{CQ8} = N \cdot I_{CQ7} = N \cdot I_1 + N \cdot \Delta I$$

That is, the current $\Delta I$ converted by the voltage-to-current converting circuit is amplified N times by a current amplifying circuit which consists of the transistors Q5 to Q10 and the constant current power supplies 24 and 26. Further, since the collector current of the transistor Q6 flows through the transistor Q9 and the transistors Q9, Q10 are current mirrors, the collector currents $I_{CQ6}$, $I_{CQ9}$ and $I_{CQ10}$ of the transistors Q6, Q9 and Q10 are the same. Hence, an electric current $I_2$ which is a collector current difference of the transistors Q10 and Q8 and flows through the resistance Rf2 can be expressed by the following formula:

$$I_2 = I_{CQ8} - I_{CQ10}$$
$$= 2 \cdot N \cdot \Delta I$$

The electric current $I_2$ may be converted to the voltage Vout, shown by the following formulas, by a current-to-voltage converting circuit which consists of the operational amplifier 28 and the resistances Rf1 and Rf2.

$$Vin = (Rg1 + Rg2) \cdot \Delta I$$
$$= 2 \cdot Rg \cdot \Delta I$$
$$Vout = Rf2 \cdot I_2$$
$$= Rf \cdot 2 \cdot N \cdot \Delta I$$
$$= (Rf / Rg) \cdot N \cdot Vin$$

"(Rf/Rg)·N" shown in the above formula denotes a gain of the differential amplifier circuit according to the present invention.

In the differential amplifier circuit of FIG. 1, resistances Rg1 and Rg2 are input impedance of the input terminals IN+ and IN−, and the voltage-to-current converting circuit consists of the limited circuit elements, namely the transistors Q1 to Q5 and Q7, the resistances Rg1 and Rg2, and the constant current power supplies 20, 22 and 24.

Figure 2:
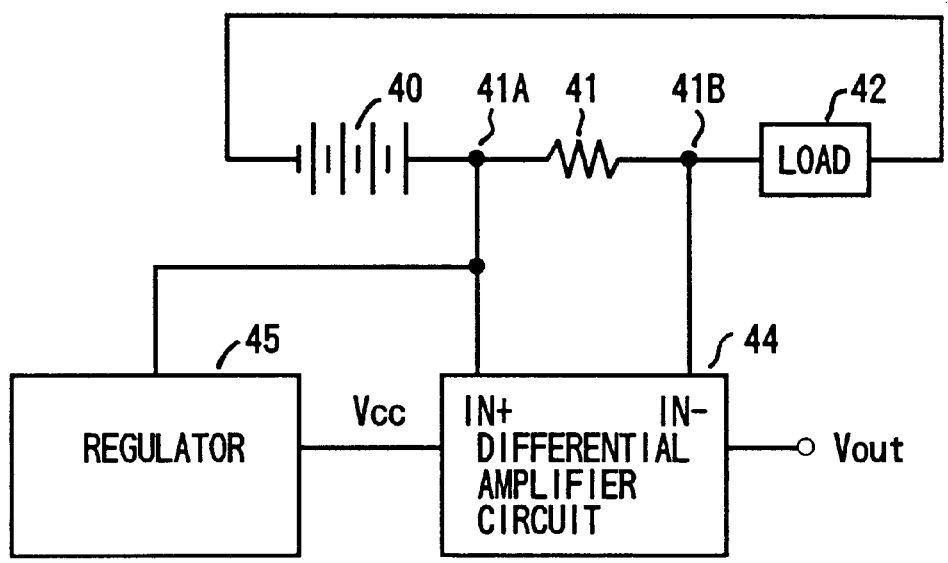
FIG. 2 is a view of a current sense amplifier circuit including the differential amplifier circuit according to the present invention.

FIG. 2 shows a current sense amplifier circuit applying the differential amplifier circuit of FIG. 1. In this diagram, reference numeral 44 denotes the differential amplifier circuit of FIG. 1. A small resistance 41 is inserted between a secondary accumulator 40 and a load 42. A voltage between two ends 41A and 41B of the small resistance 41 is applied to the input terminals IN+ and IN−. A charging/discharging current of the secondary accumulator 40 can be read from an output voltage Vout. In this case, the differential amplifier circuit 44 is supplied with a power supply Vcc obtained by stabilizing an output voltage of the secondary accumulator 40 by a regulator 45. The output voltage of the secondary accumulator 40 is, for example, 12V and the power supply Vcc stabilized by the regulator 45 is, for example, 5V.

Even with such a use, since the transistors Q1 to Q5 and Q7, which are respectively connected with the input terminals IN+ and IN−, are supplied with working power from the input terminals IN+ and IN−, the transistors Q1 to Q5 and Q7 can work without any problem even if the respective voltages of the input terminals IN+ and IN− exceed the power supply Vcc.

Further, since a total electric current flowing through the resistances Rg1 and Rg2 is a constant electric current ($4 \cdot I_0 + 2 \cdot I_1$) and is not dependent on the respective voltages of the input terminals IN+ and IN−, power consumed by the differential amplifier circuit 44 can be reduced by setting the currents $I_0$ and $I_1$ small when designing the constant current power supplies 20, 22 and 24.

In the differential amplifier circuit of FIG. 1, when common mode input voltages (constant voltages) of the input terminals IN+ and IN− are higher than α (α is, for example, 1.2V), a differential voltage therebetween can be amplified and outputted. When the common mode input voltages of the input terminals IN+ and IN− are lower than α, the differential voltage therebetween can be amplified and outputted by replacing the pnp transistors of FIG. 1 with npn transistors, the npn transistors of FIG. 1 with pnp transistors, and switching the power supply Vcc and ground.

Figure 3:
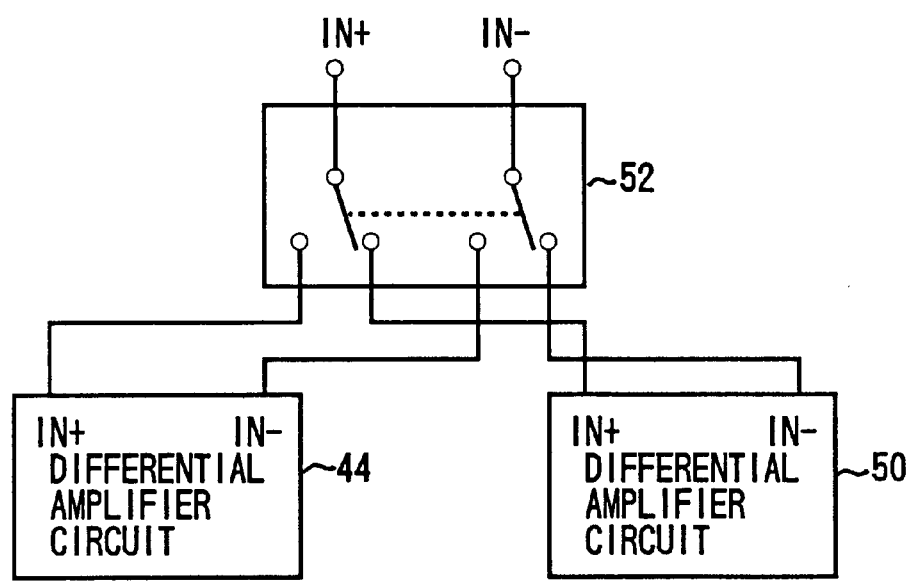
FIG. 3 is a view of a modified differential amplifier circuit according to the present invention.
Figure 4:
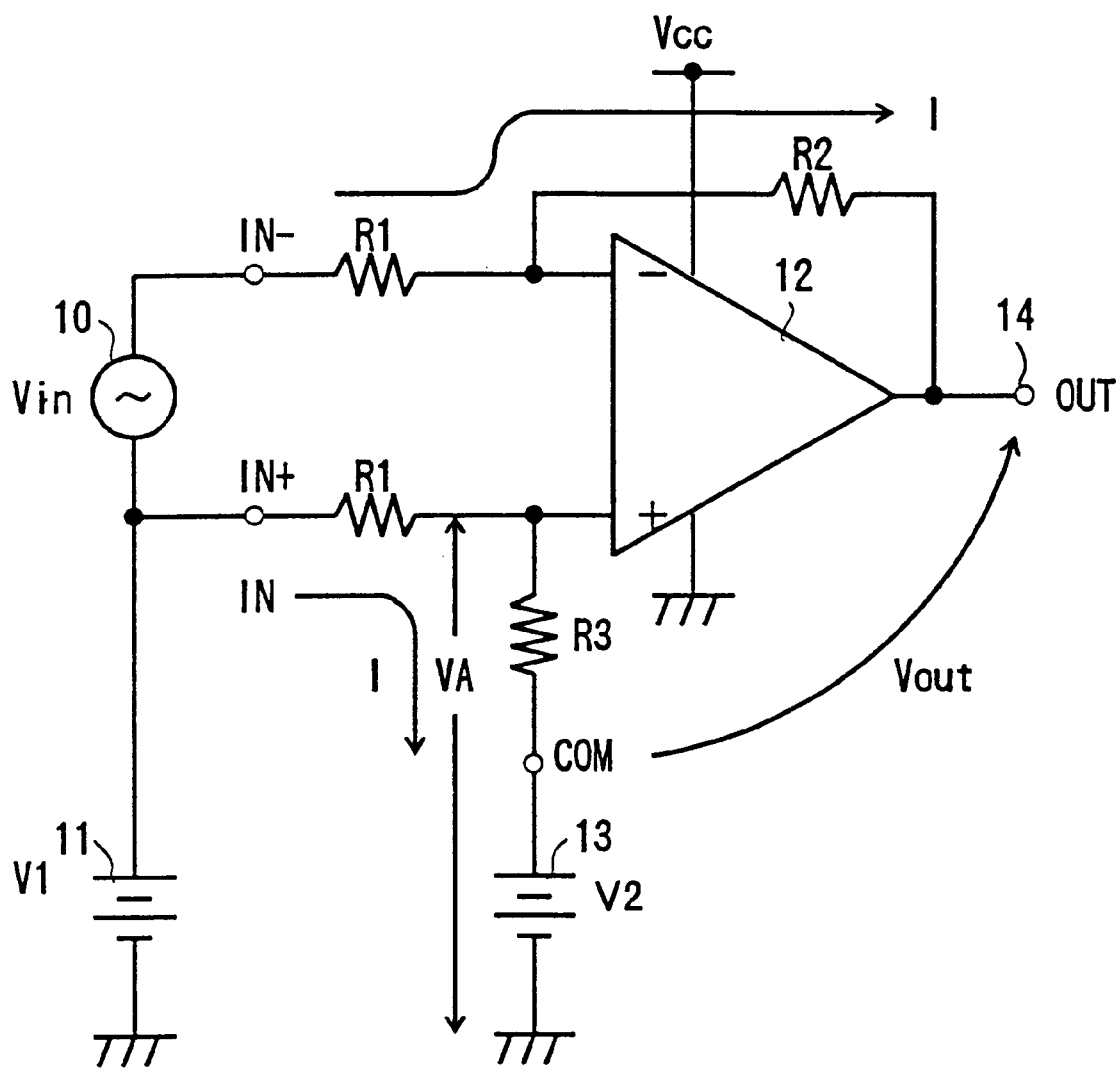
FIG. 4 is a view of a conventional differential amplifier circuit.

FIG. 3 shows a modified example in which the differential amplifier circuit 44 and a differential amplifier circuit 50 are switched by a switching portion 52 according to whether the common mode input voltages of the input terminals IN− and IN+ are higher or lower than α. In the differential amplifier circuit 50, the above-mentioned pnp transistors are interchanged with the npn transistors and the power supply Vcc is interchanged with the ground.

What is claimed is:

1. A differential amplifier for generating an output voltage by amplifying a differential input voltage applied between a pair of input terminals, said differential amplifier comprising:

a voltage-to-current converting circuit that includes a pair of resistances, wherein one of said input terminals of said pair of input terminals is connected with one end of one of said resistances and the other input terminal of said pair of input terminals is connected with one end of the other of said resistances, a potential at the other end of each of said resistances of said pair being kept constant by a feedback circuit, said voltage-to-current converting circuit generating an electric current corresponding to said differential input voltage;

a current amplifying circuit coupled to said voltage-to-current converting circuit for receiving said electric current corresponding to said differential input voltage, said current amplifying circuit including a first differential amplifying circuit and a second differential amplifying circuit, wherein said electric current corresponding to said differential input voltage is amplified as it flows from said first differential amplifying circuit to said second differential amplifying circuit; and a current-to-voltage converting circuit coupled to said current amplifying circuit in which the amplified electric current outputted from said current amplifying circuit to said current-to-voltage converting circuit is converted to the output voltage of said differential amplifier.

2. The differential amplifier as claimed in claim 1, wherein said first differential amplifying circuit includes a plurality of bipolar transistors.

3. The differential amplifier as claimed in claim 1, wherein said voltage-to-current converting circuit further includes a plurality of transistors, and power for each of said plurality of transistors is supplied by said input terminals.

4. A differential amplifier for generating an output voltage by amplifying a differential input voltage applied between a pair of input terminals, said differential amplifier comprising:

a voltage-to-current converting circuit that includes a pair of resistances, wherein one of said input terminals of said pair of input terminals is directly connected with one end of one of said resistances and the other input terminal of said pair of input terminals is connected with one end of the other of said resistances, a potential at the other end of each of said resistances of said pair being kept constant by a feedback circuit, said voltage-to-current converting circuit generating an electric current corresponding to said differential input voltage;

a current amplifying circuit coupled to said voltage-to-current converting circuit for receiving said electric current corresponding to said differential input voltage, said current amplifying circuit including a first differential amplifying circuit and a second differential amplifying circuit, wherein said electric current corresponding to said differential input voltage is amplified as it flows from said first differential amplifying circuit to said second differential amplifying circuit; and a current-to-voltage converting circuit coupled to said current amplifying circuit in which the amplified electric current outputted from said current amplifying circuit to said current-to-voltage converting circuit is converted to the output voltage of said differential amplifier.

* * * * *

UNITED STATES PATENT AND TRADEMARK OFFICE
CERTIFICATE OF CORRECTION

PATENT NO. : 6,191,654 B1
DATED : February 20, 2001
INVENTOR(S) : Ikeuchi et al.

It is certified that error appears in the above-identified patent and that said Letters Patent is hereby corrected as shown below:

<u>Title page,</u>
In the Title: delete the present title "DIFFERENTIAL AMPLIFIER CIRCUIT" and substitute therefor -- DIFFERENTIAL AMPLIFIER CIRCUIT HAVING A VOLTAGE-TO-CURRENT CONVERTER POWERED BY INPUT TERMINALS --

Signed and Sealed this

Nineteenth Day of March, 2002

Attest:

Attesting Officer

JAMES E. ROGAN
Director of the United States Patent and Trademark Office